(12) United States Patent
Flusberg et al.

(10) Patent No.: US 7,679,042 B1
(45) Date of Patent: Mar. 16, 2010

(54) FABRICATION OF TRANSDUCER STRUCTURES

(76) Inventors: Allen M. Flusberg, c/o Science Research Laboratory, Inc., 15 Ward St., Somerville, MA (US) 02143; Michael A. Huff, c/o Science Research Laboratory, 15 Ward St., Somerville, MA (US) 02143

( * ) Notice: Subject to any disclaimer, the term of this patent is extended or adjusted under 35 U.S.C. 154(b) by 320 days.

(21) Appl. No.: 11/753,258

(22) Filed: May 24, 2007

Related U.S. Application Data

(63) Continuation-in-part of application No. 11/410,812, filed on Apr. 25, 2006, now Pat. No. 7,491,922.

(60) Provisional application No. 60/808,613, filed on May 26, 2006, provisional application No. 60/674,419, filed on Apr. 25, 2005, provisional application No. 60/909,973, filed on Apr. 4, 2007.

(51) Int. Cl.
*H01L 27/00* (2006.01)

(52) U.S. Cl. .............. 250/208.1; 250/214.1; 250/338.4; 250/332; 257/431

(58) Field of Classification Search .............. 250/208.1, 250/214.1, 338.1, 338.4, 332, 370.01, 370.08; 257/414, 431, 437, 443
See application file for complete search history.

(56) References Cited

U.S. PATENT DOCUMENTS

| | | | |
|---|---|---|---|
| 2003/0132386 A1 | 7/2003 | Carr et al. | 250/338.1 |
| 2005/0074206 A1 | 4/2005 | Domash et al. | 385/47 |
| 2005/0082480 A1 | 4/2005 | Wagner et al. | 250/338.1 |
| 2007/0114622 A1* | 5/2007 | Adkisson et al. | 257/414 |

OTHER PUBLICATIONS

Janusz Bryzek, Kurt Petersen, and Wendell McCulley, "Micromachines on the March," IEEE Spectrum, May 1994, pp. 20-30.

* cited by examiner

*Primary Examiner*—Kevin Pyo
(74) *Attorney, Agent, or Firm*—Burns & Levinson LLP; Jerry Cohen; Orlando Lopez

(57) ABSTRACT

Methods for fabricating structures such as transducer pedestal structures and transducers fabricated by the methods.

13 Claims, 7 Drawing Sheets

Fig. 3a
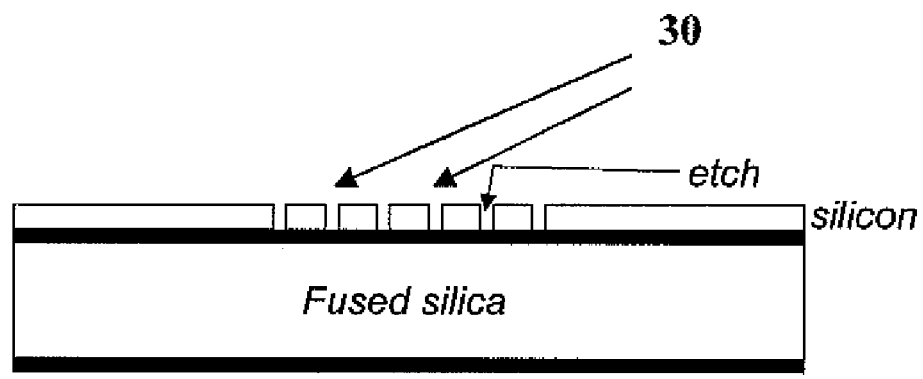
3) DRIE of silicon layer
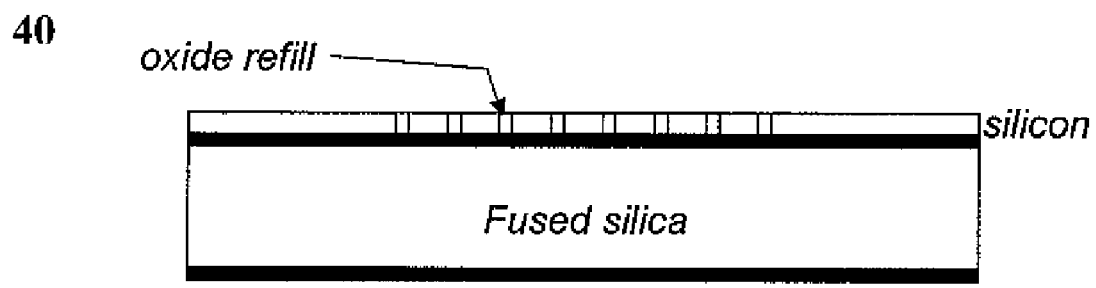
4) Oxide refill and planarization
Fig. 3b

Fig. 4a
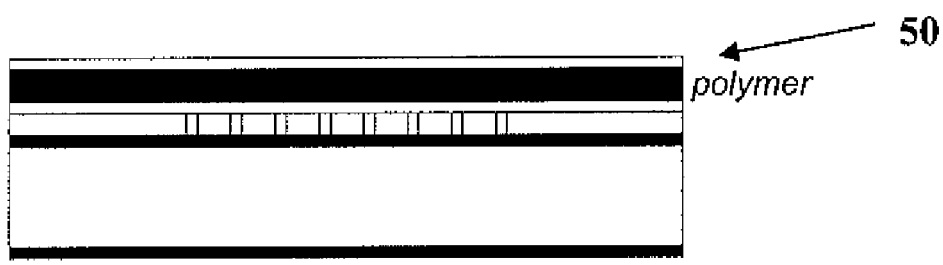
5) Deposition of infrared-absorbing polymer
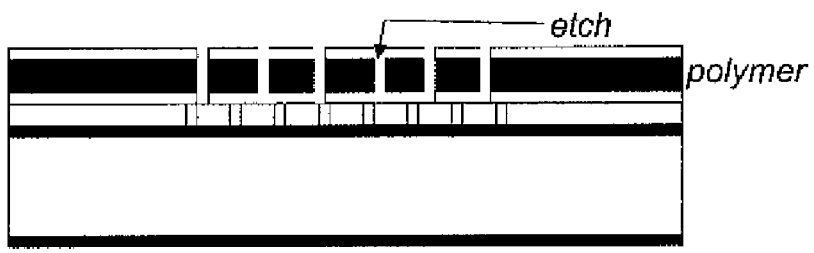
6) Etch of polymer layer to pixelate array
Fig. 4b

7) Etch of silicon to release microstructure

FABRICATION OF TRANSDUCER STRUCTURES

CROSS REFERENCE TO RELATED APPLICATIONS

This application claims priority of U.S. Provisional Application 60/808,613, FABRICATION OF TRANSDUCER STRUCTURES, filed on May 26, 2006, and of U.S. Provisional Application 60/909,973, FABRICATION OF TRANSDUCER STRUCTURES filed on Apr. 4, 2007, both of which are herein incorporated by reference in their entirety, and is a continuation by part of U.S. patent application Ser. No. 11/410,812, SYSTEMS AND METHODS FOR IMAGE ACQUISITION filed Apr. 25, 2006, which claims priority of U.S. Provisional Application 60/674,419 filed on Apr. 25, 2005, both of which are herein incorporated by reference.

STATEMENT REGARDING FEDERALLY SPONSORED RESEARCH OR DEVELOPMENT

This invention was made partially with U.S. Government support from the U.S. Army under contract W31P4Q-05-C-0260. The U.S. Government has certain rights in the invention.

BACKGROUND

Image acquisition systems are used in a variety of applications over a number of frequency ranges. In the infrared, for example, commercial applications include, but are not limited to, image analysis, condition monitoring, process control, R&D and nondestructive testing. Government applications include public safety, search and rescue, disaster response, customs and border patrol, interdiction and defense. The infrared imaging market has grown at a double-digit pace and in 2004 exceeded $1 billion. However, infrared cameras are still sold at a high price. The availability of a lower cost infrared imaging device would greatly expand applications beyond current applications and fuel a faster growth of the market. Similar comments apply to imaging devices for electromagnetic radiation in other frequency ranges.

Therefore, there is a need to provide a low-cost image acquisition system and transducers for low cost image acquisition systems.

BRIEF SUMMARY

Embodiments of methods for fabricating structures such as transducer pedestal structures and transducers obtained by the methods are disclosed.

Embodiments of methods for fabricating a pixellated transducer capable of absorbing electromagnetic radiation in a predetermined range of wavelengths are also disclosed.

Embodiments of structures fabricated by the methods of these teachings are also disclosed.

For a better understanding of the present teachings, together with other and further needs thereof, reference is made to the accompanying drawings and detailed description and its scope will be pointed out in the appended claims.

BRIEF DESCRIPTION OF THE DRAWINGS

FIGS. 3a-3b depict graphical schematic representations of results of other steps in one embodiment of the method of these teachings;

FIGS. 4a-4b depict graphical schematic representations of results of other steps in one embodiment of the method of these teachings;

DETAILED DESCRIPTION

Figure 1:
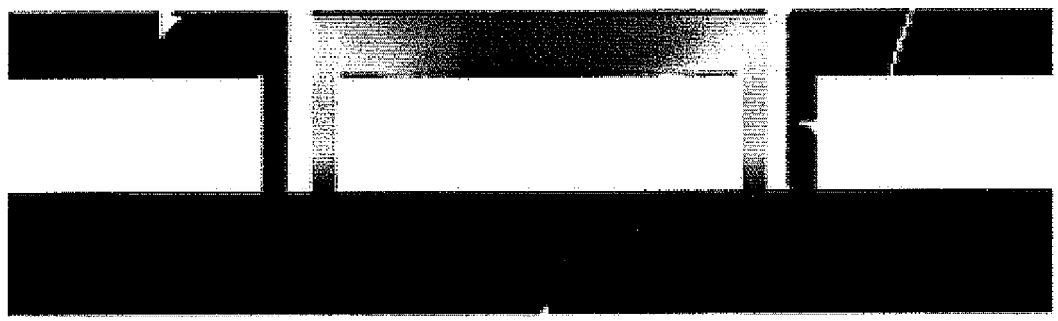
FIG. 1 is a profile of a pedestal structure of these teachings.
Figures 2A, 2B:
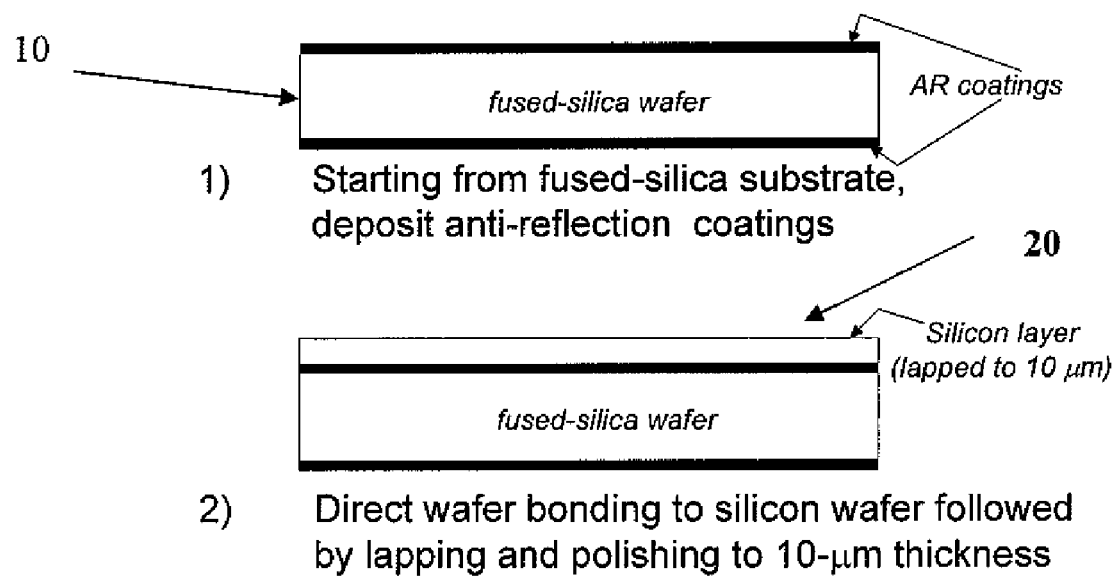
FIGS. 2a-2b depict graphical schematic representations of results of steps in one embodiment of the method of these teachings.
Figure 5:
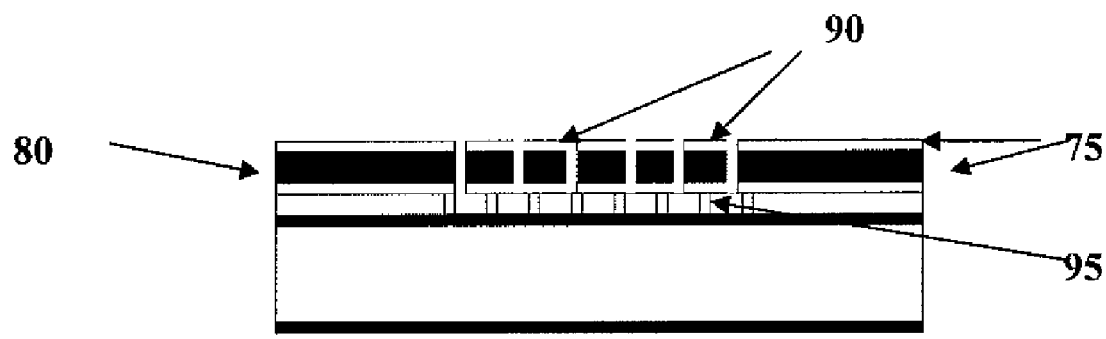
FIG. 5 depicts a graphical schematic representation of the result of a last step in one embodiment of the method of these teachings.

Embodiments of an image acquisition system are disclosed in U.S. patent application Ser. No. 11/410,812, which is incorporated by reference herein. In one embodiment, the image acquisition system disclosed therein includes a pixellated optical transducer capable of absorbing electromagnetic radiation in a first range of wavelengths, the electromagnetic radiation being received from an input source of electromagnetic radiation, another source of electromagnetic radiation in a second range of wavelengths, where the pixellated optical transducer is also capable of causing, when the electromagnetic radiation from the other source interacts with the pixellated optical transducer after absorption of a portion the electromagnetic radiation from the input source, a variation in phase of electromagnetic radiation in the second range of wavelengths emanating from the optical transducer, an optical system capable of receiving a portion of the electromagnetic radiation emanating from the other source and the portion of the electromagnetic radiation in the second range of wavelengths emanating from the optical transducer, a detector, where the optical system is also capable of imaging an interference pattern onto the detector, the interference pattern being obtained from the portion of the electromagnetic radiation emanating from the other source and the portion of the electromagnetic radiation in the second range of wavelengths emanating from the optical transducer, and an analysis component capable of obtaining intensity information from the interference pattern. The obtained intensity information provides an image of the input source Embodiments for methods for fabricating transducers for image acquisition systems, such as those described in U.S. patent application Ser. No. 11/410,812, are detailed below. One embodiment of a transducer pedestal structure, for use in the image acquisition systems described herein above, is shown in profile in FIG. 1.

One embodiment of the method of these teachings for fabricating pixellated transducers for image acquisition systems includes depositing an antireflection (AR) coating on a surface of a wafer of a predetermined material, bonding a wafer of another predetermined material to the surface of the wafer of the predetermined material, lapping and polishing to a predetermined thickness the wafer of the other predetermined material, the lapped and polished wafer of the other predetermined material constituting a layer of the another predetermined material, patterning the layer of the other predetermined material according to a predetermined pattern, refilling the patterned layer with a sacrificial material, replanarizing an exposed surface of the refilled patterned layer, depositing a polymer layer on the replanarized surface, the polymer layer being capable of absorbing electromagnetic radiation in a predetermined range of wavelengths, patterning in the polymer layer according to another predetermined pattern and removing the sacrificial material.

In some embodiments, these teachings not be limited only to that embodiment, the first predetermined material is a fused silica substrate (other possible materials include glass plates or any other appropriate material) and the other predetermined material is silicon.

In another embodiment the method of these teachings for fabricating pixellated transducers for image acquisition systems includes bonding a wafer of a first predetermined material to the surface of a wafer of a second predetermined material, lapping and polishing to a predetermined thickness the wafer of the first predetermined material, the lapped and polished wafer of the first predetermined material comprising a layer of the first predetermined material, patterning the layer of the first predetermined material according to a predetermined pattern, refilling the patterned layer with a sacrificial material, replanarizing an exposed surface of the refilled patterned layer, depositing on a surface of a first wafer of a third predetermined material a first polymer layer of a second predetermined thickness, depositing on a surface of a second wafer of the third predetermined material a second polymer layer of a third predetermined thickness, the first polymer layer and the second polymer layer being capable of absorbing electromagnetic radiation in a predetermined range of wavelengths, disposing the first polymer layer deposited surface of the first wafer on the second polymer layer deposited surface of the second wafer, adhering the first polymer layer to the second polymer layer, where the first wafer, the first polymer layer, the second polymer layer and the second wafer form a layered structure, patterning the layered structure with another predetermined pattern and removing the sacrificial layer.

In the above disclosed embodiments, pixellation of the transducer is obtained by the patterning of the polymer layer. The patterning of the layer of the other (first predetermined material in the second embodiment predetermined material and the removing the sacrificial material provides structural supports between each pixel and the wafer of the (second predetermined material in the second embodiment) predetermined material.

Exemplary embodiments are presented below in order to better elucidate the methods and systems of these teachings. In the exemplary embodiment is presented below the predetermined range of wavelengths is the infrared (IR) range. However, it should be noted that the present teachings are not limited to only that range. The exemplary embodiments presented herein below include dimensions for components in the exemplary embodiment. It should be noted that these teachings are not limited to only those dimensions.

In one exemplary embodiment, these teachings not being limited to only that embodiment, the structure consists of a pixelated array of approximately 40×40 μm² transducer pixels that are supported by approximately 2×2 μm² posts, one post per pixel corner. The posts are supported by an approximately 500-μm-thick fused-silica heat sink ("substrate"). (These teachings are not limited to only this embodiment.)

One exemplary embodiment of the fabrication technique of these teachings for the structure of FIG. 1 is summarized in FIGS. 2-5. In the embodiment presented below, the fabrication begins with the fused-silica wafer 10 (FIG. 2a), which is AR (antireflection) coated. In the second step, this AR-coated wafer is wafer bonded wafer to a silicon layer 20 (FIG. 2b), which is then lapped and polished to a predetermined thickness, for example, but not limited to, approximately 10 μm.

As indicated by FIG. 3a, in the third fabrication step an array of holes 30 are produced in the silicon layer by an appropriate technique. In the embodiment shown, a deep-reactive ion etch (DRIE) of the silicon layer produces an array of approximately 2×2 μm² holes, approximately 10 μm deep, in the silicon layer. (It should be noted that dimensions are provided for illustrative purposes and that these teachings are not limited to only those dimensions.) These holes are filled by an oxide refill 40 in Step 4 (FIG. 3b), and the surface is replanarized.

The IR-absorbing polymer 50 is deposited on the replanarized surface in Step 5, as is shown in FIG. 4a. (In some embodiments, a high reflectivity layer is deposited before and after depositing the polymer 50.) In Step 6 (FIG. 4b), the polymer array is etched to create the pixelated structure, and in Step 7 (FIG. 5) the silicon is etched to release the microstructure.

Another embodiment of the method of these teachings is described hereinbelow.

In one instance, the structure comprises a polymer disposed between the two plates of a predetermined material such as, but not limited to fused silica, glass or any other appropriate material. The high reflectivity coating (HR) may be applied to the plates either before or after the polymer is disposed between the two plates.

Figure 6A:
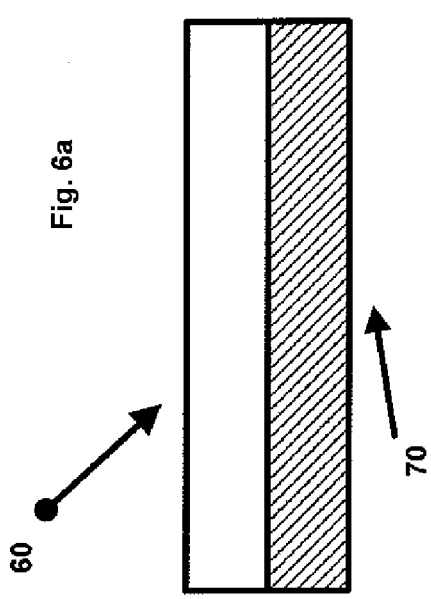
FIGS. 6a-6b depict graphical schematic representations of results of one step in another embodiment of the method of these teachings.
Figure 6B:
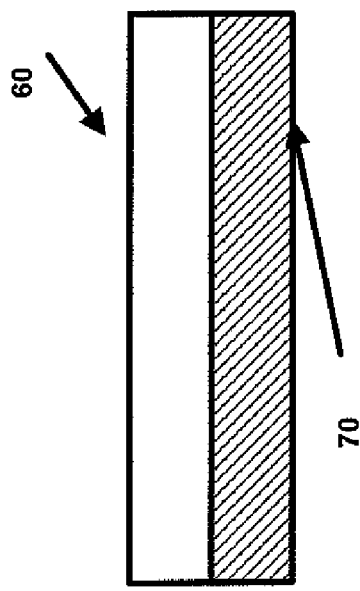
Figure 7A:
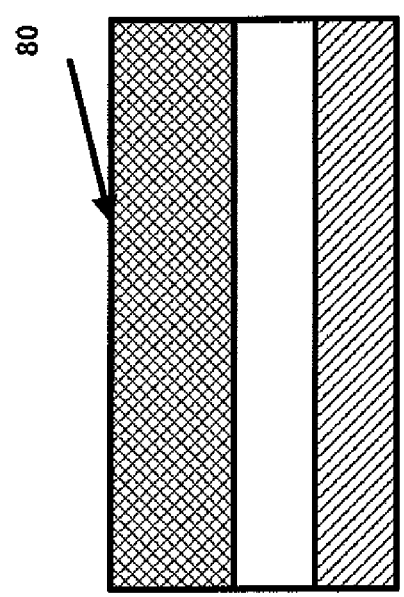
FIGS. 7a-7b depict graphical schematic representations of results of another step in another embodiment of the method of these teachings.
Figure 7B:
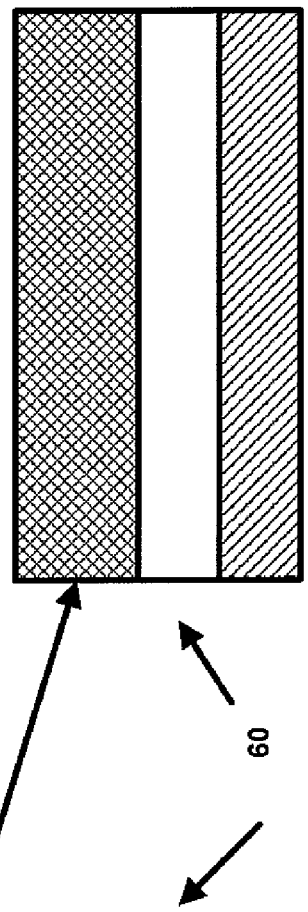

In the embodiment presented below, shown in FIGS. 6a-8, the fabrication begins with two fused-silica wafers or sheets 60. (It should be noted that other base materials besides fused silica are within the scope of these teachings.) Each fused-silica wafer or sheet is coated on one surface with a high reflectivity coating 70 (FIGS. 6a, 6b). In one instance, in an intermediate step, a AR coating is deposited on the other surface of each of the two fused-silica wafers or sheets. In the second step (FIGS. 7a, 7b), a polymer coating 80 is spun on the other surface of each of the two fused-silica wafers or sheets. In the instance in which an HR coating has been deposited on one surface of each of the two fused-silica wafers or sheets, the surface on which the polymer coating is spun may be AR coated. The thickness of each polymer coating is selected such that the sum of the thickness of the two coatings is substantially equal to a predetermined thickness. In one instance, the thickness of each polymer coating is substantially equal to one half the predetermined thickness. The thickness of each of the two fused-silica wafers or sheets is selected such that the heat capacity of the fused-silica wafer or sheet with the polymer layer is not increased significantly over that of the polymer layer alone.

Figure 8:
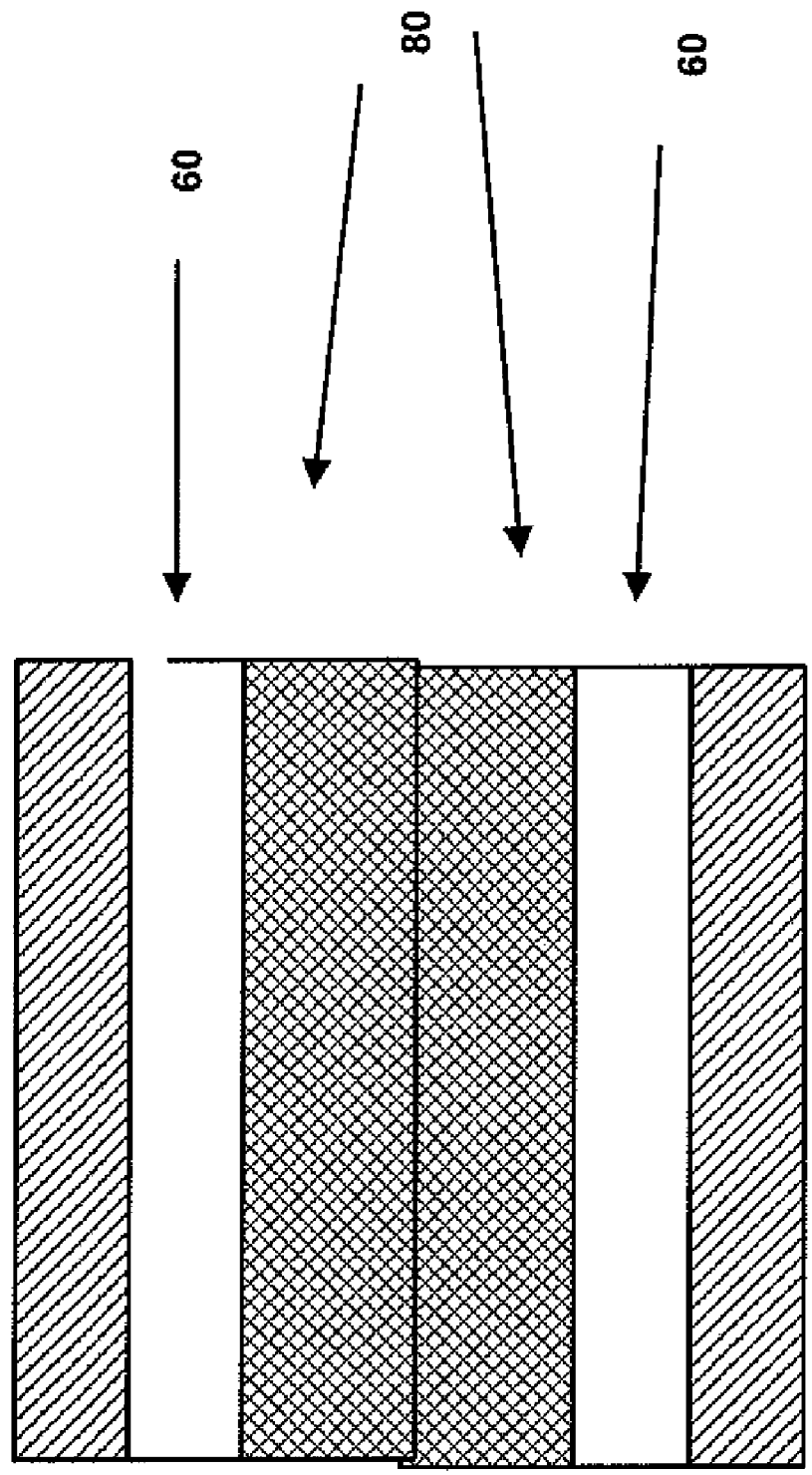
FIG. 8 depicts a graphical schematic representation of results of a further step in another embodiment of the method of these teachings.

In the third step of the method of this embodiment, the surfaces of the two fused-silica wafers or sheets on which the polymer coating is located opposite to each other (FIG. 8). Heat and/or pressure are applied in order to cause the two polymer coatings to substantially adhere to each other.

In one instance, the polymer can be selected such that the difference in refractive index between the polymer and the base material is such that the reflection at the interface between the polymer and the base material is substantially negligible. (For example, in the embodiment in which the base material is silica, the polymer could be selected to be nitrocellulose or a similar polymer with the appropriate refractive index.) In that instance, the intermediate step of depositing an AR coating can be dispensed with since the AR coating is not needed.

In another instance, the refractive index of the polymer is selected such that the refractive index discontinuity at the interface between the polymer and the base material is substantially small such that only a substantially thin AR coating is required.

While the second embodiment described hereinabove was described as including the step of coating each fused-silica wafer or sheet on one surface with a high reflectivity (HR) coating as the initial step, embodiments are also possible in which the high reflectivity coating (HR) is deposited after the structure comprising a polymer disposed between the two sheets of base material is obtained. In those embodiments, the intermediate step (if the intermediate step is needed), the second and third steps are performed and, subsequently, the step of coating each fused-silica water or sheet on one surface with a high reflectivity coating is performed. Embodiments in which only one surface of the structure is coated with a high reflectivity coating or in which the high reflectivity coating is not present are also within the scope of this teachings.

In one instance, the structure comprising a polymer disposed between the two sheets of base material is bonded onto a silicon layer, which had been wafer bonded to AR-coated silica wafer. In one embodiment, the silicon layer had been previously lapped and polished to a predetermined thickness, as in the first embodiment described hereinabove. In one instance, the silicon layer had also been deep-reactive ion etched as described hereinabove in the first embodiment. In another instance, the structure comprising a polymer disposed between the two sheets of base material replaces the IR-absorbing polymer in step 5 (FIG. 4*a*) of the first embodiment described hereinabove. In that instance, the predetermined thickness of the polymer is substantially equal to the thickness required for the transducer of interest.

In embodiments of these teachings, a pixellated transducer (such as shown in FIG. 1 or in FIG. 5) is fabricated using the methods of these teachings. In the above disclosed embodiments, pixellation of the transducer is obtained by the patterning of the polymer layer. The patterning 30 of the silicon layer 20 and the removing the sacrificial material 40 provides structural supports 95 between each pixel 90 and the silica wafer 10.

In one embodiment, the pixellated transducer includes transducer a polymer 80 (or 50, FIG. 4*a*) film coated with two stacks of reflective coatings 75, one on each of its two surfaces. The optical thickness of the transducer is altered by heating due to absorbed radiation in the predetermined range of wavelengths (for example, IR in the exemplary embodiments shown above). Specifically, the physical thickness of the film and the refractive index of the film are altered by the heating, as is the physical thicknesses and refractive indices of the reflective coating layers.

Although the above embodiments of the method of these teachings have been described in terms of particular materials (fused silica for the heat sink, silicon for the material to be processed), it should be noted that other materials having the appropriate characteristics are also within the scope of these teachings. It should also be noted that other combinations of the first and second embodiment also possible in within the scope of this teachings.

In one embodiment, MEMS (micromechanical systems) techniques are utilized in fabricating the transducers (see, for example, Janusz Bryzek, Kurt Petersen, and Wendell McCulley, "Micromachines on the March," IEEE Spectrum, May 1994, pp. 20-30). (MEMS utilizes microelectronic processing techniques to reduce mechanical components to a scale comparable to that of microelectronics.)

Although the invention has been described with respect to various embodiments, it should be realized these teachings is also capable of a wide variety of further and other embodiments within the spirit and scope of the appended claims.

What is claimed is:

1. A method for fabricating a pixellated transducer absorbing electromagnetic radiation in a predetermined range of wavelengths, the method comprising the steps of:
    bonding a wafer of a second predetermined material to a surface of a wafer of a first predetermined material;
    lapping and polishing to a first predetermined thickness the wafer of said second predetermined material; the lapped and polished wafer of said second predetermined material comprising a layer of said second predetermined material;
    patterning the layer of said second predetermined material according to a predetermined pattern;
    refilling the patterned layer of said second predetermined material with a sacrificial material;
    planarizing an exposed surface of the refilled patterned layer of said second predetermined material;
    depositing on a surface of a first wafer of a third predetermined material a first polymer layer of a second predetermined thickness;
    depositing on a surface of a second wafer of said third predetermined material a second polymer layer of a third predetermined thickness; said first polymer layer and said second polymer layer absorbing electromagnetic radiation in a predetermined range of wavelengths;
    disposing the first polymer layer deposited surface of the first wafer on the second polymer layer deposited surface of the second wafer;
    adhering the first polymer layer to the second polymer layer; said first wafer, said first polymer layer, said second polymer layer and said second wafer comprising a layered structure;
    patterning the layered structure with another predetermined pattern; and
    removing the sacrificial layer.

2. The method of claim 1 further comprising the step of AR coating a surface of the wafer of the second predetermined material before bonding the wafer of the second predetermined material; wherein the wafer of the first predetermined material is bonded onto the AR coated surface.

3. The method of claim 1 further comprising the steps of:
    coating a surface of the first wafer of the third predetermined material with a high reflectivity coating; wherein the first polymer layer is deposited on an opposite surface of the first wafer.

4. The method of claim 1 further comprising the steps of:
    coating a surface of the second wafer of the third predetermined material with a high reflectivity coating; wherein the second polymer layer is deposited on an opposite surface of the second wafer.

5. The method of claim 1 wherein the step of depositing said first polymer layer on the surface of the first wafer comprises spin coating said first polymer layer; and
    wherein the step of depositing said second polymer layer on the surface of the second wafer comprises spin coating said second polymer layer.

6. The method of claim 1 wherein said first polymer layer and said second polymer layer comprise nitrocellulose.

7. A pixellated transducer fabricated by the method of:
    bonding a wafer of a second predetermined material to a surface of a wafer of a first predetermined material;

lapping and polishing to a first predetermined thickness the wafer of said second predetermined material; the lapped and polished wafer of said second predetermined material comprising a layer of said second predetermined material;

patterning the layer of said second predetermined material according to a predetermined pattern;

refilling the patterned layer of said second predetermined material with a sacrificial material;

planarizing an exposed surface of the refilled patterned layer of said second predetermined material;

depositing on a surface of a first wafer of a third predetermined material a first polymer layer of a second predetermined thickness;

depositing on a surface of a second wafer of said third predetermined material a second polymer layer of a third predetermined thickness; said first polymer layer and said second polymer layer absorbing electromagnetic radiation in a predetermined range of wavelengths;

disposing the first polymer layer deposited surface of the first wafer on the second polymer layer deposited surface of the second wafer;

adhering the first polymer layer to the second polymer layers; said first wafer, said first polymer layer, said second polymer layer and said second wafer comprising a layered structure;

patterning the layered structure with another predetermined pattern; pixelation being obtained by said patterning of the polymer layer; and removing the sacrificial layer; said patterning of the layer of said another predetermined material and said removing the sacrificial material providing structural supports between each pixel and said wafer of said predetermined material.

8. The pixellated transducer of claim 7 wherein the method of fabrication further comprises the step of:
coating a surface of the first wafer of the third predetermined material with a high reflectivity coating; wherein the first polymer layer is deposited on an opposite surface of the first wafer.

9. The pixellated transducer of claim 7 wherein the method of fabrication further comprises the step of:
coating a surface of the second wafer of the third predetermined material with a high reflectivity coating; wherein the second polymer layer is deposited on an opposite surface of the second wafer.

10. The pixellated transducer of claim 7 wherein, in the method of fabrication, the step of depositing said first polymer layer on the surface of the first wafer comprises spin coating said first polymer layer; and
wherein the step of depositing said second polymer layer on the surface of the second wafer comprises spin coating said second polymer layer.

11. The pixellated transducer of claim 7 wherein said predetermined material comprises silica.

12. The pixelated transducer of claim 7 wherein said another predetermined material comprises silicon.

13. A method for fabricating a pixellated transducer absorbing electromagnetic radiation in a predetermined range of wavelengths, the method comprising the steps of:
depositing an antireflection (AR) coating on a surface of a wafer of a first predetermined material;

bonding a wafer of a second predetermined material to the surface of the wafer of the first predetermined material;

lapping and polishing to a first predetermined thickness the wafer of said second predetermined material; the lapped and polished wafer of said second predetermined material comprising a layer of said second predetermined material;

patterning the layer of said second predetermined material according to a predetermined pattern;

refilling the patterned layer of said second predetermined material with a sacrificial material;

planarizing an exposed surface of the refilled patterned layer of said second predetermined material;

depositing on a surface of a first wafer of a third predetermined material a first polymer layer of a second predetermined thickness;

depositing on a surface of a second wafer of said third predetermined material a second polymer layer of a third predetermined thickness; said first polymer layer and said second polymer layer absorbing electromagnetic radiation in a predetermined range of wavelengths;

disposing the first polymer layer deposited surface of the first wafer on the second polymer layer deposited surface of the second wafer;

adhering the first polymer layer to the second polymer layer; said first wafer, said first polymer layer, said second polymer layer and said second wafer comprising a layered structure;

patterning the layered structure with another predetermined pattern; and removing the sacrificial layer.

* * * * *